(12) United States Patent
Cooper et al.

(10) Patent No.: US 9,843,083 B2
(45) Date of Patent: Dec. 12, 2017

(54) MULTI-MODE FILTER HAVING A DIELECTRIC RESONATOR MOUNTED ON A CARRIER AND SURROUNDED BY A TRENCH

(71) Applicant: MESAPLEXX PTY LTD, Eight Mile Plains (AU)

(72) Inventors: Steven J. Cooper, Brisbane (AU); David R. Hendry, Brisbane (AU); Chris Boyle, Brisbane (AU); Peter B. Kenington, Chepstow (GB)

(73) Assignee: Mesaplexx PTY LTD, Queensland (AU)

( * ) Notice: Subject to any disclaimer, the term of this patent is extended or adjusted under 35 U.S.C. 154(b) by 67 days.

(21) Appl. No.: 15/019,178

(22) Filed: Feb. 9, 2016

(65) Prior Publication Data
US 2016/0172733 A1 Jun. 16, 2016

Related U.S. Application Data

(62) Division of application No. 13/647,936, filed on Oct. 9, 2012, now abandoned.

(51) Int. Cl.
*H01P 1/20* (2006.01)
*H01P 1/208* (2006.01)
(Continued)

(52) U.S. Cl.
CPC .......... *H01P 1/2086* (2013.01); *H01P 1/2002* (2013.01); *H01P 1/213* (2013.01);
(Continued)

(58) Field of Classification Search
CPC ...... H01P 1/2086; H01P 1/2088; H01P 7/105; H01P 1/2084; H01P 1/20; H01P 1/2002; H01P 1/213
(Continued)

(56) References Cited

U.S. PATENT DOCUMENTS

| 2,890,421 A | 5/1959 | Currie |
| 3,657,670 A | 4/1972 | Kitazume et al. ......... 333/73 W |

(Continued)

FOREIGN PATENT DOCUMENTS

| CA | 1189154 A2 | 6/1985 |
| CA | 1194157 A1 | 9/1985 |

(Continued)

OTHER PUBLICATIONS

Dupont, "Properties Handbook", Dupont, p. 4 (30 pgs.), Nov. 2003.
(Continued)

*Primary Examiner* — Benny Lee
(74) *Attorney, Agent, or Firm* — Harrington & Smith

(57) ABSTRACT

The present invention relates to a multi-mode filter comprising a carrier on which is mounted a dielectric resonator having a covering of an electrically conductive material in which there is provided an aperture and a coupling structure for coupling input signals to the dielectric resonator or for extracting filtered output signals from the dielectric resonator. The carrier is provided with an enclosing formation of electrically conductive material, which enclosing formation is electrically coupled to the electrically conductive covering of the dielectric resonator, such that the covering and the enclosing formation together form an electrically conductive enclosure for the dielectric resonator. The enclosure formed from the covering of the dielectric resonator and the enclosing formation increases the isolation of the filter and reduces leakage. The filter of the present invention is particularly suitable for use in cascaded resonator filter arrangements, and in duplex/diplex filters.

15 Claims, 8 Drawing Sheets

(51) Int. Cl.
   *H01P 1/213* (2006.01)
   *H01P 7/10* (2006.01)
   *H05K 1/02* (2006.01)

(52) U.S. Cl.
   CPC ............ *H01P 7/105* (2013.01); *H05K 1/024* (2013.01); *H05K 1/0219* (2013.01); *H05K 1/0231* (2013.01)

(58) Field of Classification Search
   USPC ..................................... 333/202, 219.1, 134
   See application file for complete search history.

(56) References Cited

U.S. PATENT DOCUMENTS

| | | | |
|---|---|---|---|
| 4,142,164 A | 2/1979 | Nishikawa et al. | |
| 4,614,920 A | 9/1986 | Tong | |
| 4,622,523 A | 11/1986 | Tang | |
| 4,623,857 A | 11/1986 | Nishikawa et al. | |
| 4,630,009 A | 12/1986 | Tang | |
| 4,644,305 A | 2/1987 | Tang et al. | |
| 4,675,530 A | 6/1987 | Rose et al. | |
| 4,792,771 A | 12/1988 | Siu | |
| 4,879,533 A | 11/1989 | de Muro et al. | 333/206 |
| 4,963,844 A | 10/1990 | Konishi et al. | 333/208 |
| 5,023,866 A | 6/1991 | De Muro | 370/24 |
| 5,307,036 A | 4/1994 | Turunen et al. | 333/202 |
| 5,325,077 A | 6/1994 | Ishikawa et al. | |
| 5,585,331 A | 12/1996 | Mansour et al. | |
| 5,589,807 A | 12/1996 | Tang | |
| 5,710,530 A | 1/1998 | Wada et al. | |
| 5,731,751 A | 3/1998 | Vangala | |
| 5,805,035 A | 9/1998 | Accatino et al. | |
| 5,821,837 A | 10/1998 | Accatino et al. | |
| 6,005,457 A | 12/1999 | Wu | |
| 6,016,091 A | 1/2000 | Hidaka et al. | 333/202 |
| 6,025,291 A | 2/2000 | Murakawa | 501/136 |
| 6,066,996 A | 5/2000 | Goertz et al. | |
| 6,072,378 A | 6/2000 | Kurisu et al. | |
| 6,133,808 A | 10/2000 | Arakawa | 333/134 |
| 6,160,463 A | 12/2000 | Arakawa et al. | 333/202 |
| 6,278,344 B1 | 8/2001 | Kurisu et al. | |
| 6,346,867 B2 | 2/2002 | Arakawa et al. | 333/208 |
| 6,462,629 B1 | 10/2002 | Blair et al. | |
| 6,549,094 B2 | 4/2003 | Takagi et al. | 333/134 |
| 6,667,837 B1 | 12/2003 | Shockey | 359/738 |
| 6,762,658 B1 | 7/2004 | Isomura et al. | 333/202 |
| 6,825,740 B2 | 11/2004 | Kundu | 333/202 |
| 6,834,429 B2 | 12/2004 | Blair et al. | |
| 6,853,271 B2 | 2/2005 | Wilber et al. | |
| 6,897,741 B2 | 5/2005 | Ando et al. | |
| 6,954,122 B2 | 10/2005 | Wilber et al. | |
| 7,042,314 B2 | 5/2006 | Wang et al. | |
| 7,068,127 B2 | 6/2006 | Wilber et al. | |
| 7,138,891 B2 | 11/2006 | Andoh et al. | |
| 7,605,678 B2 | 10/2009 | Ando et al. | |
| 7,755,456 B2 | 7/2010 | Salehi | |
| 8,022,792 B2 | 9/2011 | Howard | |
| 8,325,077 B2 | 12/2012 | Gentric | 341/173 |
| 2001/0000429 A1 | 4/2001 | Arakawa et al. | 333/208 |
| 2001/0024147 A1 | 9/2001 | Arakawa et al. | 333/135 |
| 2002/0024410 A1 | 2/2002 | Guglielmi et al. | 333/202 |
| 2002/0039058 A1 | 4/2002 | Sano et al. | 333/202 |
| 2003/0006864 A1 | 1/2003 | Hattori et al. | |
| 2003/0090344 A1 | 5/2003 | Wang et al. | 333/202 |
| 2003/0141948 A1 | 7/2003 | Maekawa et al. | |
| 2003/0227360 A1 | 12/2003 | Kirihara et al. | 333/239 |
| 2004/0041660 A1 | 3/2004 | Kawahara et al. | |
| 2004/0056736 A1 | 3/2004 | Enokihara et al. | 333/202 |
| 2005/0128031 A1 | 6/2005 | Wilber et al. | 333/202 |
| 2005/0140474 A1 | 6/2005 | Kim et al. | 333/219.1 |
| 2005/0253672 A1 | 11/2005 | Enokihara et al. | 333/219.1 |
| 2006/0139127 A1 | 6/2006 | Wada et al. | |
| 2008/0018391 A1 | 1/2008 | Bates | 327/557 |
| 2008/0061905 A1 | 3/2008 | Ishikawa | |
| 2008/0211601 A1 | 9/2008 | Bates | 333/186 |
| 2010/0231323 A1 | 9/2010 | Vangala et al. | |
| 2011/0006856 A1 | 1/2011 | Kim et al. | |
| 2011/0128097 A1 | 6/2011 | Park et al. | |
| 2014/0077990 A1 | 3/2014 | Abraham | 342/357.22 |

FOREIGN PATENT DOCUMENTS

| | | |
|---|---|---|
| EM | EP 0751579 B1 | 11/2002 |
| EM | EP 0656670 B1 | 1/2003 |
| EM | EP 1458051 A | 9/2004 |
| EP | 0883203 A2 | 12/1998 |
| EP | 0997973 A1 | 5/2000 |
| GB | 2409344 A | 6/2005 |
| JP | H0216801 A | 1/1990 |
| JP | 1079636 | 3/1998 |
| JP | 10209808 | 8/1998 |
| JP | H-10224113 A | 8/1998 |
| JP | H-10284988 A | 10/1998 |
| JP | H-10294644 A | 11/1998 |
| JP | H-10322161 A | 12/1998 |
| JP | 2000295072 A | 10/2000 |
| JP | 200160804 A | 3/2001 |
| JP | 200160805 A | 3/2001 |
| JP | 2001160702 A | 6/2001 |
| JP | 2002135003 A | 5/2002 |
| JP | 2002151906 A | 5/2002 |
| JP | 2002217663 A | 8/2002 |
| JP | 2003037476 A | 2/2003 |
| JP | 2003188617 A | 7/2003 |
| JP | 2003234635 A | 8/2003 |
| JP | 2004312287 A | 11/2004 |
| JP | 2004312288 A | 11/2004 |
| JP | 2005065040 A | 3/2005 |
| JP | 2005167577 A | 6/2005 |
| JP | 2005223721 A | 6/2005 |
| WO | 9301626 A1 | 1/1993 |
| WO | 0077883 A1 | 12/2000 |
| WO | 02078119 A1 | 10/2002 |
| WO | 2009029282 A1 | 3/2009 |

OTHER PUBLICATIONS

Awai, Ikuo, et al; Equivalent-Circuit Representation and Explanation of Attenuation Poles of a Dual-Mode Dielectric-Resonator Bandpass Filter; Transactions on Microwave Theory and Techniques; (Dec. 1998); pp. 2159-2163; vol. 46; No. 12; IEEE.

Awai, Ikuo, et al; Coupling of Dual Modes in a Dielectric Waveguide Resonator and it's Application to Bandpass Filters; Proceedings of the 25th European Microwave Conference; (1995); pp. 533-537; Conf. 25; Yamaguchi University, Japan.

Weily, Andrew R, et al; Rotationally Symmetric FDTD for Fast Design and Wideband Spurious Performance Prediction of Dielectric Resonator Filters; Telecom Group, Falculty of Engineering, University of Technology; (1999); pp. 844-847.

Chaudhary, Raghvendra Kumar, et al.; Multi-Level Multi-Permittivity Dielectric Resonator: A New Approach for Improved Spurious Free Window; Proceedings of the 40th European Microwave Conference; (Sep. 28-30, 2010); pp. 1194-1197; Paris, France.

Sano, Kazuhisa, et al.; Application of the Planar I/O Terminal to Dual Mode Dielectric Waveguide Filters; International Microwave Symposium Digest; (Jun. 11-18, 2000); pp. 1173-1176; Boston, MA.

Wang, Chi, et al; A Practical Triple-Mode Monoblock Bandpass Filter for Base Station Applications; MTT-S Digest; (2001); pp. 1783-1786.

Awai, Ikuo, et al; A Dual Mode Diefectri Waveguide Resonator and its Application to Bandpass Filters; IEICE Transactions on Electronics: (Aug. 1995); pp. 1018-1025; vol. E78-C; No. 8.

Bekheit, Maged, et al.; Modeling and Optimization of Compact Microwave Bandpass Filters; IEEE Transactions of Microwave Theory and Techniques; (Feb. 2008); pp. 420-430; vol. 56; No. 2.

Guo Qing Luo et al:, Bandwidth-Enhanced Low-Profile Cavity-Backed Slot antenna by Using Hybrid SIW Cavity MOdes, IEEE

(56) References Cited

OTHER PUBLICATIONS

Transactions on Antennas and Propagation, IEEE Service Center, Piscataway, NJ, US, vol. 60, No. 4, Apr. 1, 2012 (Apr. 1, 2012), pp. 1698-1704.
Guo Qing Luo et al., A :F]unction power divider FED circularly polarized cavity backed slot antenna, Microwave and Optical Technology Letters, vol. 54, No. 1, Jan. 22, 2012 (Jan. 22, 2012), pp. 107-109.
Guo Qing Luo et al., Development of Low Profile Cavity Backed Crossed Slot Antennas for Planar Integration. IEEE Transactions on Antennas and Propagation, IEEE Service Center, Piscataway, NJ, US, vol. 57, No. 10, Oct. 1, 2009 (Oct. 1, 2009), pp. 2972-2979, XP0112761444.
Sarrazin J et al., Pattern Reconfigurable Cubic Antenna, IEEE Transactions on Antennas and Propagation, IEEE Service Center, Piscataway, NJ, US, vol. 57, No. 2, Feb. 1, 2009 (Feb. 1, 2009), pp. 310-317.
Yaaid Yusuf et al., Compact Low-Loss Integration of High-Q 3-0 Filters With Highly Efficient Antennas, IEEE Transactions on Microwave Theory and Techniques, IEEE Service Center, Piscataway, NJ, US, vol. 59, No. 4, Apr. 1, 2011 (Apr. 1, 2011), pp. 857-865.
Trak Ceramics, "Dielectric Materials", Trak Ceramics, Inc., p. 1 (8 pgs.), Oct. 11, 2010.

MULTI-MODE FILTER HAVING A DIELECTRIC RESONATOR MOUNTED ON A CARRIER AND SURROUNDED BY A TRENCH

CROSS-REFERENCE TO RELATED APPLICATIONS

The present application is a divisional application of U.S. patent application Ser. No. 13/647,936, filed on Oct. 9, 2012, now abandoned, the disclosure of which is hereby incorporated by reference in its entirety.

BACKGROUND

The present invention relates to a multi-mode filter.

DESCRIPTION OF THE PRIOR ART

The reference in this specification to any prior publication (or information derived therefrom), or to any matter which is known, is not, and should not be taken as an acknowledgment or admission or any form of suggestion that the prior publication (or information derived therefrom) or known matter forms part of the common general knowledge in the field of endeavour to which this specification relates.

Single mode dielectric filters are in widespread use in many communications systems, and are used in both in low power and high power applications within the cellular communications industry. In particular, duplex filters, which are used in many cellular telephone handsets, typically employ single mode dielectric filter technology.

Single mode dielectric filters typically include a resonator made of a dielectric material such as a ceramic. In many filtering applications, a steep roll-off and a wide pass-band bandwidth are desired filter characteristics. In order to achieve these characteristics in a single mode dielectric filter, it is typically necessary to cascade a number of resonators in series. Cascading resonators in this way typically results in a significant increase in the loss in the (desired) pass-band, due to both the insertion loss of the dielectric material itself (i.e. the dielectric losses within that material) and the coupling losses in transferring energy into and out of the dielectric.

Interest in the use of multi-mode dielectric filters is growing, since these filters allow the same piece of dielectric material (or "puck") to be effectively re-used multiple times, to form a more complex filter characteristic. A multi-mode dielectric filter typically has a steeper roll-off and a wider pass-band bandwidth than an equivalent single-mode dielectric filter could achieve. Use of a multi-mode dielectric filter in place of cascaded single mode resonators will typically also result in lower losses, due to the reduction in the number of times the signal needs to be coupled into and out of the dielectric material.

SUMMARY OF THE INVENTION

According to some embodiments, the invention provides a multi-mode filter comprising: a carrier on which is mounted a dielectric resonator, the dielectric resonator having a covering of an electrically conductive material in which there is provided an aperture; and a coupling structure for coupling input signals to the dielectric resonator or for extracting filtered output signals from the dielectric resonator, wherein the carrier is provided with an enclosing formation of a grounded electrically conductive material, where the enclosing formation is electrically coupled to the electrically conductive covering of the dielectric resonator, such that the covering and the enclosing formation together form an electrically conductive enclosure for the dielectric resonator.

The enclosure formed by the combination of the enclosing formation and the covering of the dielectric resonator has the effect of substantially reducing leakage from the resonator, thereby permitting an improvement in filter characteristics of the filter. Moreover, this improved leakage performance permits the filter to be used in a cascaded filter arrangement without compromising characteristics such as stop band isolation of the cascaded filter arrangement.

The enclosing formation is preferably electrically grounded.

In some embodiments, the enclosing formation may comprise a continuous or almost continuous formation of electrically conducting material.

The carrier may be provided with a trench of electrically conductive material which surrounds the resonator in a plane of the carrier, the trench being electrically grounded.

The trench may comprise a side wall and a base portion, such that the enclosing formation comprises a side wall and a base portion of the trench.

The carrier may be provided with a conductive layer on which the dielectric resonator is mounted, the conductive layer being electrically coupled to the trench such that the enclosing formation comprises a portion of the conductive layer and the side wall and base portion of the trench.

The carrier on which the dielectric resonator is mounted may be a first carrier, in which case the filter may comprise a second carrier on which the first carrier is mounted, the second carrier having a groundplane layer to which the enclosing formation is electrically coupled to electrically ground the enclosing formation.

The enclosing formation may have an aperture generally corresponding to the aperture of the covering of the dielectric resonator, the enclosing formation being electrically coupled to the covering of the dielectric resonator such that the aperture of the covering is aligned with the aperture of the enclosing formation.

The coupling structure may be electrically coupled to a corresponding contact track provided within the aperture of the enclosing formation.

The carrier may be of a printed circuit board material.

A further embodiment of the invention provides a cascaded resonator filter arrangement comprising: a first filter of the type described above and a second filter of the type described above, wherein an output of the first filter is electrically coupled to an input of the second filter.

In this case, the carrier of the first filter and the carrier of the second filter may comprise a single carrier that is common to the first and second filters.

A further embodiment of the invention provides a duplex or diplex filter comprising a transmit filter according of the type described above and a receive filter of the type described above.

In this case, the carrier of the first filter and the carrier of the second filter may comprise a single carrier that is common to the transmit and receive filters.

BRIEF DESCRIPTION OF THE DRAWINGS

An example of the present invention will now be described, strictly by way of example, with reference to the accompanying drawings, in which.

DETAILED DESCRIPTION OF EXAMPLES OF THE INVENTION

Figure 1:
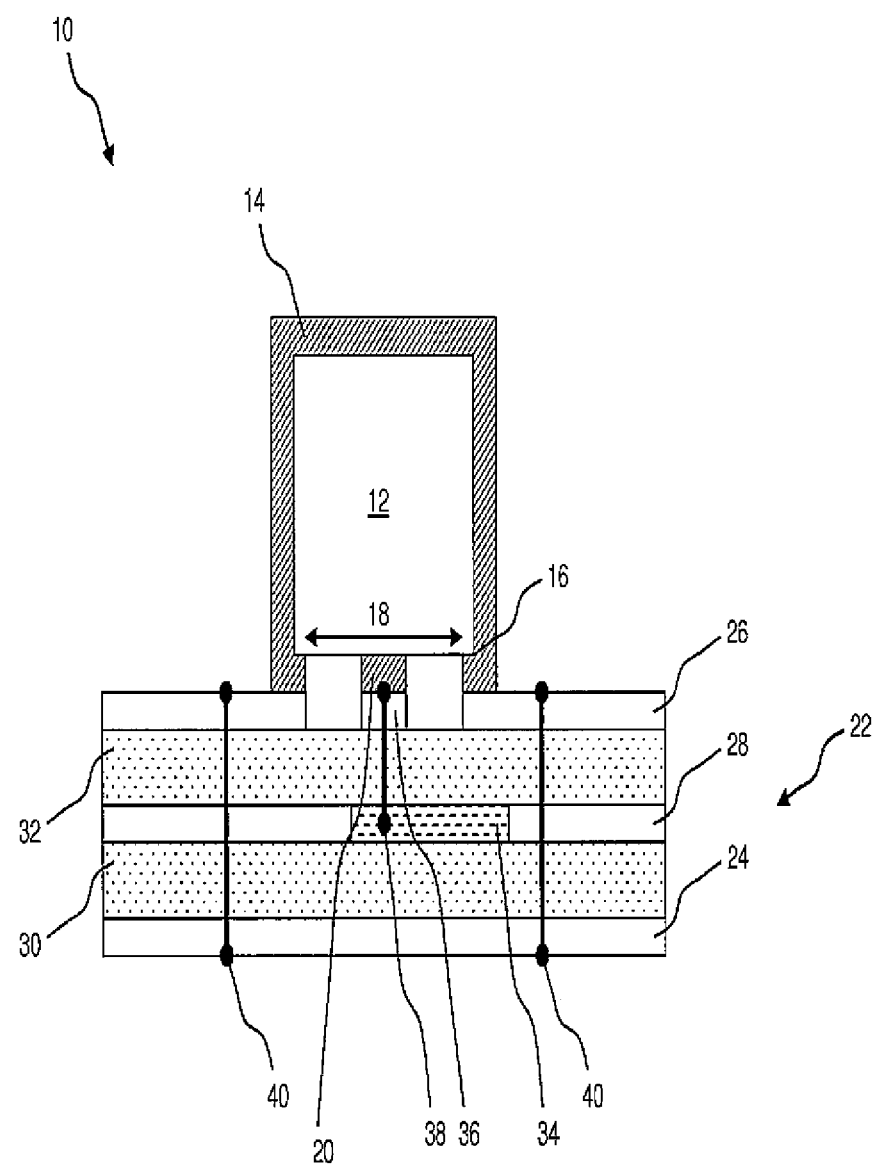
FIG. 1 is a schematic cross-sectional representation of a multi-mode dielectric filter.

FIG. 1 is a schematic cross-sectional representation of a multi-mode dielectric filter. In the example illustrated in FIG. 1, the multi-mode filter (shown generally at 10) comprises a dielectric resonator 12, which in the example is in the form of a generally cuboidal "puck" of dielectric material such as a ceramic material having a high dielectric constant. The cuboidal puck of dielectric material, forming the dielectric resonator 12, is provided on five of its six faces with a coating or covering 14 of an electrically conductive material such as silver or another electrically conductive metal. The coating 14 extends also partially over a sixth face 16 of the dielectric resonator 12, thereby defining an aperture 18 in the coating 14 on the sixth face 16. One or more coupling structures 20 are provided on the sixth face 16 of the dielectric material to permit a signal to be filtered to be input to the dielectric resonator 12 and/or to permit filtered output signals to be extracted from the dielectric resonator 12.

The dielectric resonator 12 is mounted on a carrier 22, which in the example illustrated in FIG. 1 is a printed circuit board (PCB), but which may alternatively be of another dielectric material such as ceramic or glass. The PCB has lower and upper groundplane layers 24, 26 and a central connection layer 28. Lower and upper layers 30, 32 of PCB dielectric material, having a low dielectric constant, are disposed between the lower groundplane layer 24 and the central connection layer 28, and between the central connection layer 28 and the upper groundplane layer 26, respectively. The upper groundplane layer 26 includes an aperture generally corresponding in shape and size to the aperture 18 in the coating 14 of the dielectric resonator 12. The central connection layer 28 includes an input or output connection track 34, which is electrically connected by means of a via 38 to a PCB connection track 36 disposed within the aperture of the upper groundplane layer 26, the PCB connection track 36 being electrically isolated from the upper groundplane layer 26. Further vias 40 electrically connect the upper and lower groundplane layers 24, 26.

With the dielectric resonator 12 positioned on the carrier 22 as illustrated in FIG. 1, the coating 14 of the dielectric resonator 12 is electrically coupled to the upper groundplane 26 of the carrier, and the coupling structure 20 of the dielectric resonator 12 is electrically coupled to the PCB connection track 36, which is in turn electrically coupled to the input or output connection track 34. Thus, a signal to be filtered can be input to the dielectric resonator 12 or a filtered output signal can be extracted from the dielectric resonator 12 as appropriate by means of the input or output connection track 24.

Multi-mode filters such as the one illustrated in FIG. 1 typically have a low cost structure, a low loss and a small size. This is essential in active antenna applications, where many filters are required in each active antenna product. For example, a 900 MHz active antenna product typically requires 16 filters. Unless small, low-cost, low-loss filters are used, the product becomes either too heavy or too expensive to be deployed on a large scale.

Some applications require a sharp roll-off between the pass-band and the stop band(s) of a filter, which may not be realisable using a single filter, even where a multi-mode filter such as that illustrated in FIG. 1 is used. In such applications, it is typical to cascade multiple resonators 12.

Figure 2:
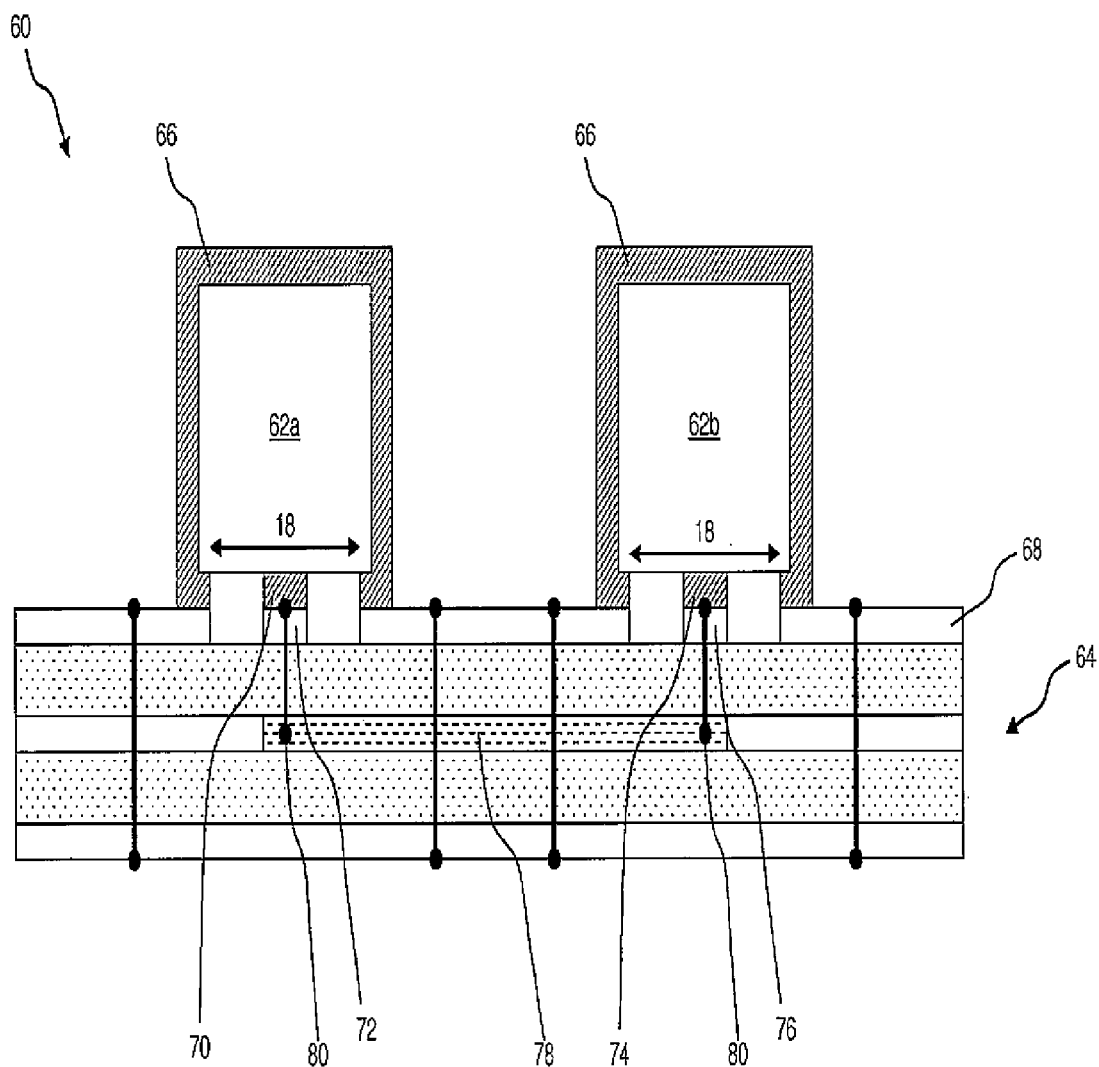
FIG. 2 is a schematic cross-sectional representation of a filter arrangement using cascaded resonators.

Such an arrangement of cascaded resonators is shown generally at 60 in FIG. 2, which is a schematic cross-sectional view of a filter arrangement which uses two cascaded resonators.

In the arrangement illustrated in FIG. 2, first and second dielectric resonators 62a, 62b are mounted on a common carrier 64, in a manner similar to that described above with reference to FIG. 1. Thus, each of the dielectric resonators 62a, 62b has an apertured coating or covering 66 of an electrically conductive material such as silver or another electrically conductive metal, and apertures 18 are shown. The first and second dielectric resonators 62a, 62b are mounted on the carrier such that their coatings electrically couple to an upper groundplane 68 of the carrier 64.

The first dielectric resonator 62a is provided with a coupling structure 70, which is electrically coupled to a PCB connection track 72 of the carrier 64 to permit a filtered output signal to be extracted from the first dielectric resonator 62a. The second dielectric resonator 62b is provided with a coupling structure 74, which is electrically coupled to a PCB connection track 76 of the carrier 64 to permit a signal to be filtered to be input to the second dielectric resonator 62b. The PCB connection tracks 72 and 76 are each connected to a common connector track 78 by vias 80, such that a signal extracted from the first dielectric resonator 62a is input to the second dielectric resonator 62b for further filtering. In this way, the required filter characteristics can be realised using the cascaded dielectric resonators 62a, 62b.

One disadvantage of the cascaded dielectric resonator arrangement illustrated in FIG. 2 is that the overall filter losses due to the insertion loss within the dielectric resonators 62a, 62b and the coupling losses in transferring energy into and out of the dielectric resonators 62a, 62b are too high for some applications, such as diplexers for use in transceivers. It can also be difficult to achieve sufficient isolation between the individual dielectric resonators 62a, 62b in a cascaded arrangement of the type illustrated in FIG. 2 for the overall filter to achieve its theoretical capabilities, particularly with regard to stop band isolation, as leakage occurs through the carrier 64 on which the cascaded dielectric resonators 62a, 62b are mounted. In the particular case of a duplex or diplex filter configuration for use in a transceiver, leakage may also occur between the transmit and receive portions of the filter.

Figure 3:
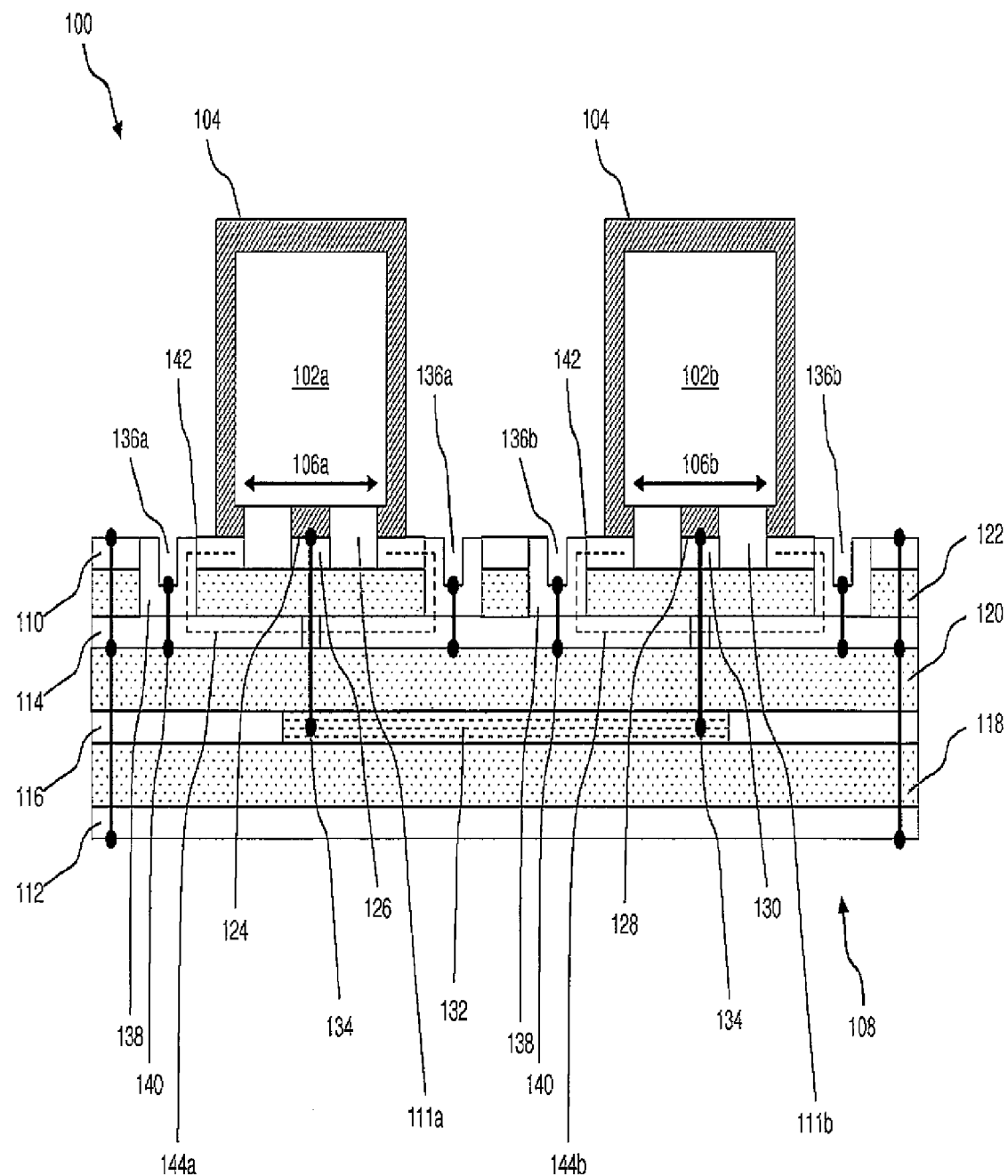
FIG. 3 is a schematic cross-sectional representation of a filter arrangement using cascaded resonators according to an embodiment of the present invention.

Referring now to FIG. 3, an arrangement of cascaded dielectric resonators forming a filter is shown generally at 100. The filter 100 is made up of two generally similar dielectric resonators 102a, 102b, each being formed as a generally cuboidal puck of a dielectric material such as a ceramic having a high dielectric constant. Each of the dielectric resonators 102a, 102b has a coating or covering 104 of an electrically conductive material such as silver or another electrically conductive metal. The coating 104 extends over all six faces of the dielectric resonators 102a, 102b, although apertures 106a, 106b are provided in the coating 104 in one face (shown as the lower face in FIG. 3) of each of the dielectric resonators 102a, 102b, to permit connections to be made to the dielectric material of the dielectric resonators 102a, 102b.

The first and second dielectric resonators 102a, 102b are mounted on a common carrier 108, which may be, for example, a printed circuit board (PCB), but which may alternatively be of another dielectric material such as ceramic or glass. The carrier 108 has an upper conductive layer 110 of a conductive material such as copper, lower and upper groundplane layers 112, 114, respectively, and a central connection layer 116. Lower and upper layers 118, 120 of PCB dielectric material, having a low dielectric constant, are disposed between the lower groundplane layer 112 and the central connection layer 116, and between the central connection layer 116 and the upper groundplane layer 114, respectively. A further layer 122 of dielectric material, such as PCB material, ceramic or glass, is disposed between the upper groundplane layer 114 and the upper conductive layer 110.

The upper conductive layer 110 is provided with apertures 111a, 111b, which correspond generally in shape and size to the apertures 106a, 106b of the dielectric resonators 102a, 102b. It will be appreciated that the apertures 111a, 111b in the upper conductive layer 110 need not correspond exactly to the apertures 106a, 106b of the dielectric resonators 102a, 102b. For example, the apertures 106a, 106b of the dielectric resonators 102a, 102b may be slightly larger than the apertures 111a, 111b in the upper conductive layer 326. The lower faces of the first and second dielectric resonators 102a, 102b are mounted on the upper conductive layer 110, with the apertures 106a, 106b in the coatings 104 of the dielectric resonators 102a, 102b aligned with the apertures 111a, 111b in the upper conductive layer 110, such that that the electrically conductive coatings 104 each have a portion which surrounds each of the apertures 106a, 106b and each electrically couples the coatings 104 of the dielectric resonators 102a, 102b to the upper conductive layer 110 of the carrier 108.

The first dielectric resonator 102a is provided with one or more coupling structures 124, which are electrically coupled to one or more corresponding PCB connection tracks 126 provided within the aperture 111a of the upper conductive layer 110 of the carrier 108, to permit a signal to be filtered to be input to the first dielectric resonator 102a, and/or to permit a filtered output signal to be extracted from the first dielectric resonator 102a. Similarly, the second dielectric resonator 102b is provided with one or more coupling structures 128, which are electrically coupled to PCB connection tracks 130 provided within the aperture 111b of the upper conductive layer 110 of the carrier 108, to permit a signal to be filtered to be input to the second dielectric resonator 102b, and/or to permit a filtered output signal to be extracted from the second dielectric resonator 102b. The PCB connection tracks 126 and 130 are each connected to a common connector track 132 by vias 134, such that a signal extracted from the first dielectric resonator 102a is input to the second dielectric resonator 102b for further filtering.

Figure 4:
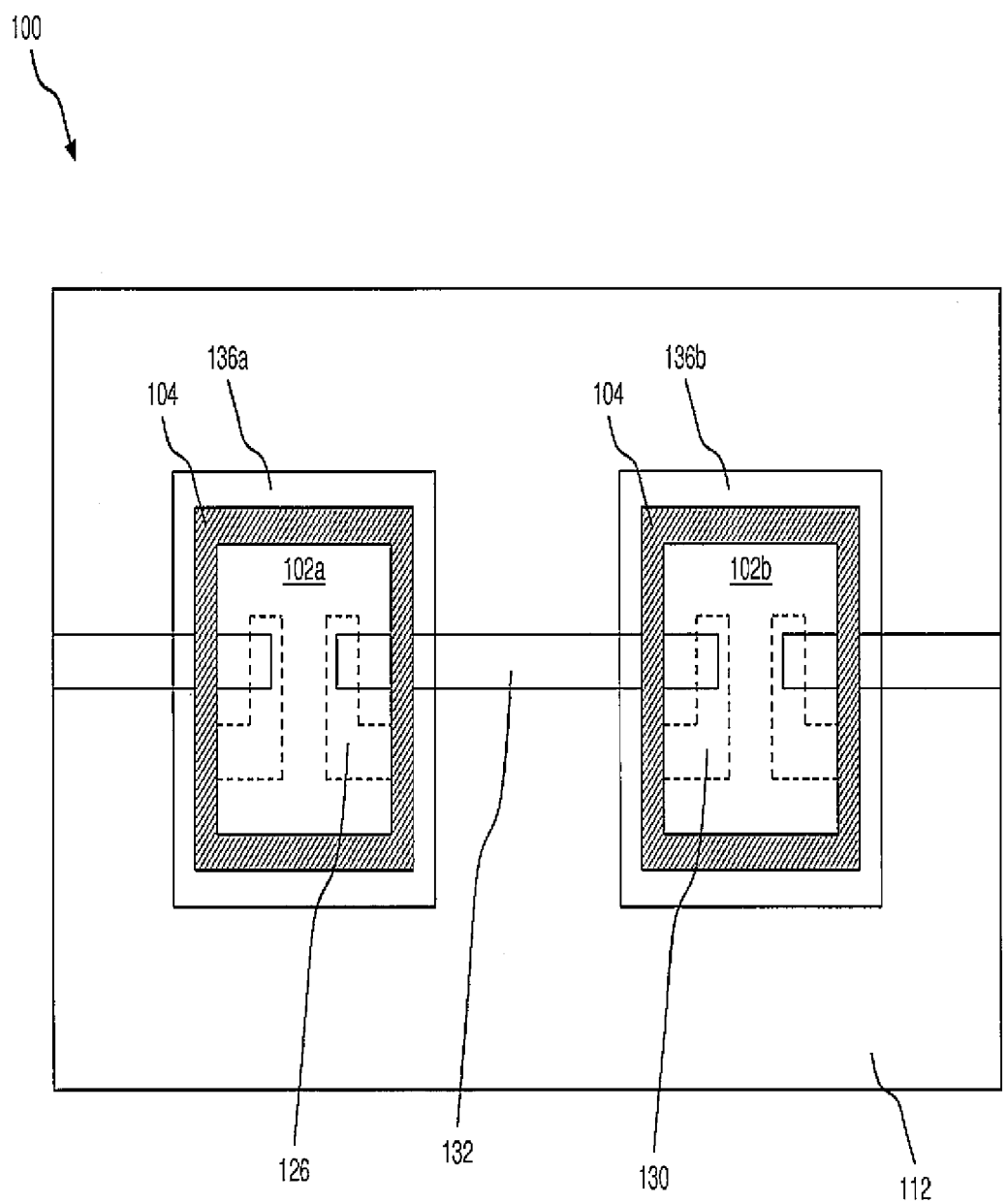
FIG. 4 is a schematic view from below of the arrangement illustrated in FIG. 3.

The upper conductive layer 110 of the carrier 108 is formed with first and second trenches 136a, 136b of an electrically conductive material, such as copper, which presents a low impedance to radio frequency currents. The trenches 136a, 136b surround the lower faces of the first and second dielectric resonators 102a, 102b in the plane of the upper conductive layer, as can be seen more clearly from FIG. 4, and extend from an upper surface of the upper conductive layer 110 into the carrier 108, as can be more clearly seen from FIG. 3. FIG. 4 illustrates the following from FIG. 3: the filter 100; dielectric resonators 102a, 102b; coatings 104; groundplane layers 112; PCB connection tracks 126, 130; common connector track 132, and first and second trenches 136a, 136b. Each of the first and second trenches 136a, 136b has a base portion 138 which is positioned adjacent the upper groundplane 114, and is electrically coupled to the upper groundplane 114 by means of vias 140 or by directly bonding the base portion 138 of the trench 136a, 136b to the upper groundplane 114, for example using a conductive bond such as solder, or plating using an electroplating process. Thus, as can be seen most clearly in FIG. 3, the combination of the upper conductive layer 110, side walls 142, and base portions 138 of the trenches 136a, 136b and the upper groundplane 114, forms respective first and second continuous electrically conductive enclosing formations, as shown in dashed outline at 144a and 144b. These electrically conductive enclosing formations 144a, 144b are electrically grounded by virtue of the upper groundplane 114, and are electrically coupled to the electrically conductive coatings 104 of the first and second dielectric resonators 102a, 102b, and thus the first and second dielectric resonators 102a, 102b are substantially enclosed in respective first and second grounded electrically conductive enclosures made up of the coatings 104 and the respective first and second enclosing formations 144a, 144b. These grounded electrically conductive enclosures have the effect of enclosing fields (electric or magnetic) present in the dielectric resonators 102a, 102b, thus improving isolation of, and reducing leakage from, the dielectric resonators 102a, 102b, and thus lead to improved characteristics of the filter 100 in comparison to filters such as that illustrated in FIG. 2. In the example illustrated in FIG. 3, the trenches 136a, 136b take the form of open-topped channels with a generally rectangular cross-section, but it will be appreciated that the same effect can be achieved using trenches of any cross-sectional shape, for example a trench with a generally U-shaped cross-section, such that the base portion is curved, a trench having a generally V-shaped cross-section, or a trench with substantially parallel sides and a base portion having a generally V-shaped cross-section.

Figure 5:
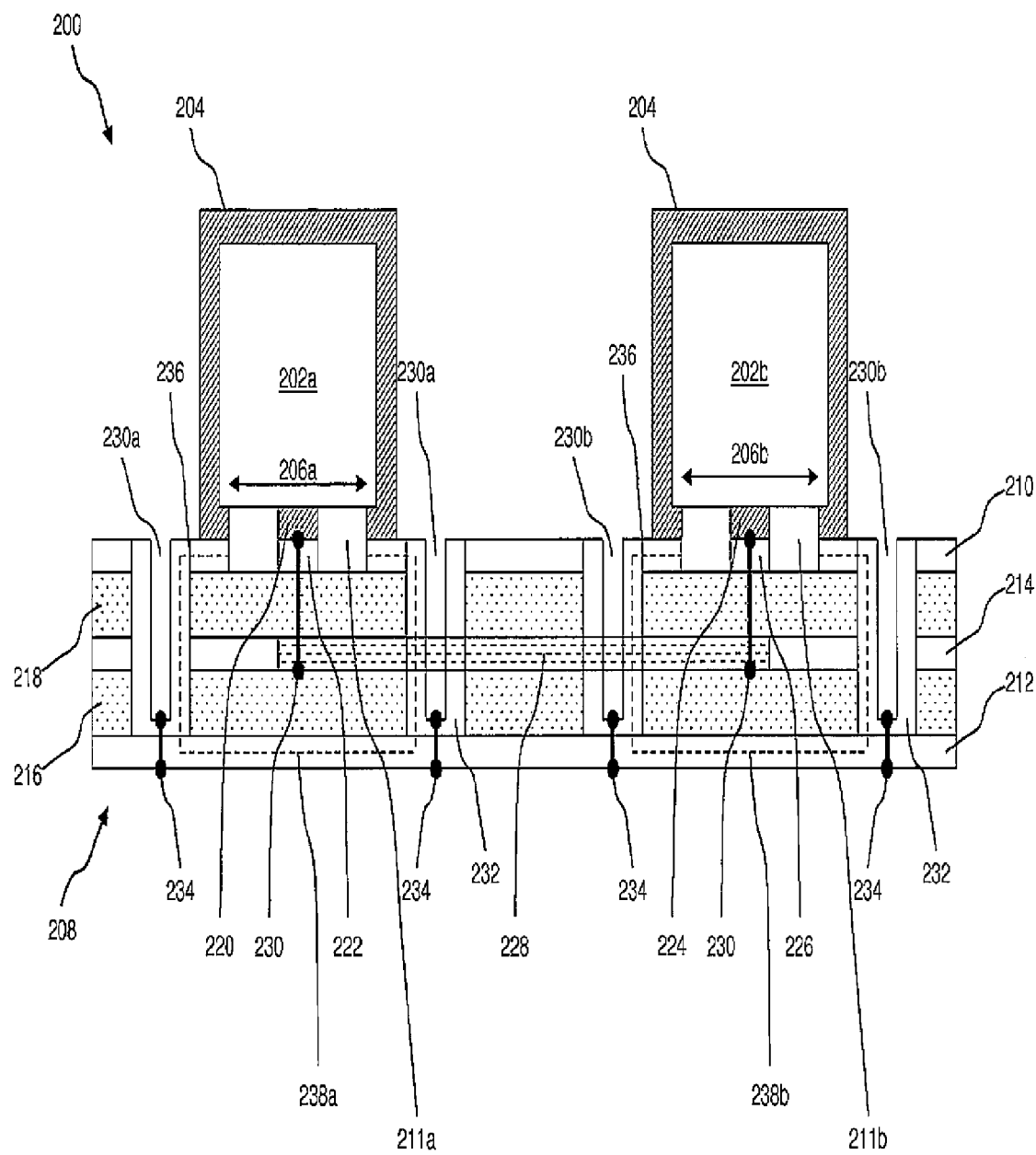
FIG. 5 is a schematic cross-sectional representation of a filter arrangement using cascaded resonators according to an alternative embodiment of the present invention.

FIG. 5 is a schematic cross-sectional view of an alternative arrangement of cascaded dielectric resonators forming a filter 200. As in the embodiment illustrated in FIG. 3, the filter 200 is made up of two generally similar dielectric resonators 202a, 202b, each being formed as a generally cuboidal puck of a dielectric material such as a ceramic having a high dielectric constant. Each of the dielectric resonators 202a, 202b has a coating or covering 204 of an electrically conductive material such as silver or another electrically conductive metal. The coating 204 extends over all six faces of the dielectric resonators 202a, 202b, although apertures 206a, 206b are provided in the coating 204 in one face (shown as the lower face in FIG. 5) of each of the dielectric resonators 202a, 202b, to permit connections to be made to the dielectric material of the dielectric resonators 202a, 202b.

The first and second dielectric resonators 202a, 202b are mounted on a common carrier 208, which may be, for example, a printed circuit board (PCB), but which may alternatively be of another dielectric material such as ceramic or glass. The carrier has an upper conductive layer 210 of a conductive material such as copper, a lower groundplane layer 212, and a central connection layer 214. Lower and upper layers 216, 218 of dielectric material, such as PCB material, ceramic or glass, are disposed between the lower groundplane layer 212 and the central connection layer 214, and between the central connection layer 214 and the upper conductive layer 210, respectively.

The upper groundplane layer 210 is provided with apertures 211a, 211b, which generally correspond in shape and size to the apertures 206a, 206b of the dielectric resonators 202a, 202b. It will be appreciated that the apertures 211a, 211b in the upper groundplane layer 210 need not correspond exactly to the apertures 206a, 206b of the dielectric resonators 202a, 202b. For example, the apertures 206a, 206b of the dielectric resonators 202a, 202b may be slightly larger than the apertures 211a, 211b in the upper groundplane layer 210. The lower faces of the first and second dielectric resonators 202a, 202b are mounted on the upper conductive layer 210, with the apertures 206a, 206b of the first and second dielectric resonators 202a, 202b aligned with the apertures 211a, 211b of the upper groundplane 210 of the carrier 208, such that that portion of the electrically conductive coatings 204 which surrounds each of the apertures 206a, 206b electrically couples the coating 204 of the dielectric resonators 202a, 202b to the upper conductive layer 210 of the carrier 208.

The first dielectric resonator 202a is provided with one or more coupling structures 220, which are electrically coupled to one or more corresponding PCB connection tracks 222 disposed within the aperture 211a of the upper groundplane layer 210 of the carrier 208, to permit a signal to be filtered to be input to the first dielectric resonator 202a, and/or to permit a filtered output signal to be extracted from the first dielectric resonator 202a. Similarly, the second dielectric resonator 202b is provided with one or more coupling structures 224, which are electrically coupled to a PCB connection track 226 disposed within the aperture 211b of the upper groundplane 210 of the carrier 208, to permit a signal to be filtered to be input to the second dielectric resonator 202b and/or to permit a filtered output signal to be extracted from the second dielectric resonator 202b. The PCB connection tracks 222 and 226 are each connected to a common connector track 228 by vias 230, such that a signal extracted from the first dielectric resonator 202a is input to the second dielectric resonator 202b for further filtering.

Figure 6:
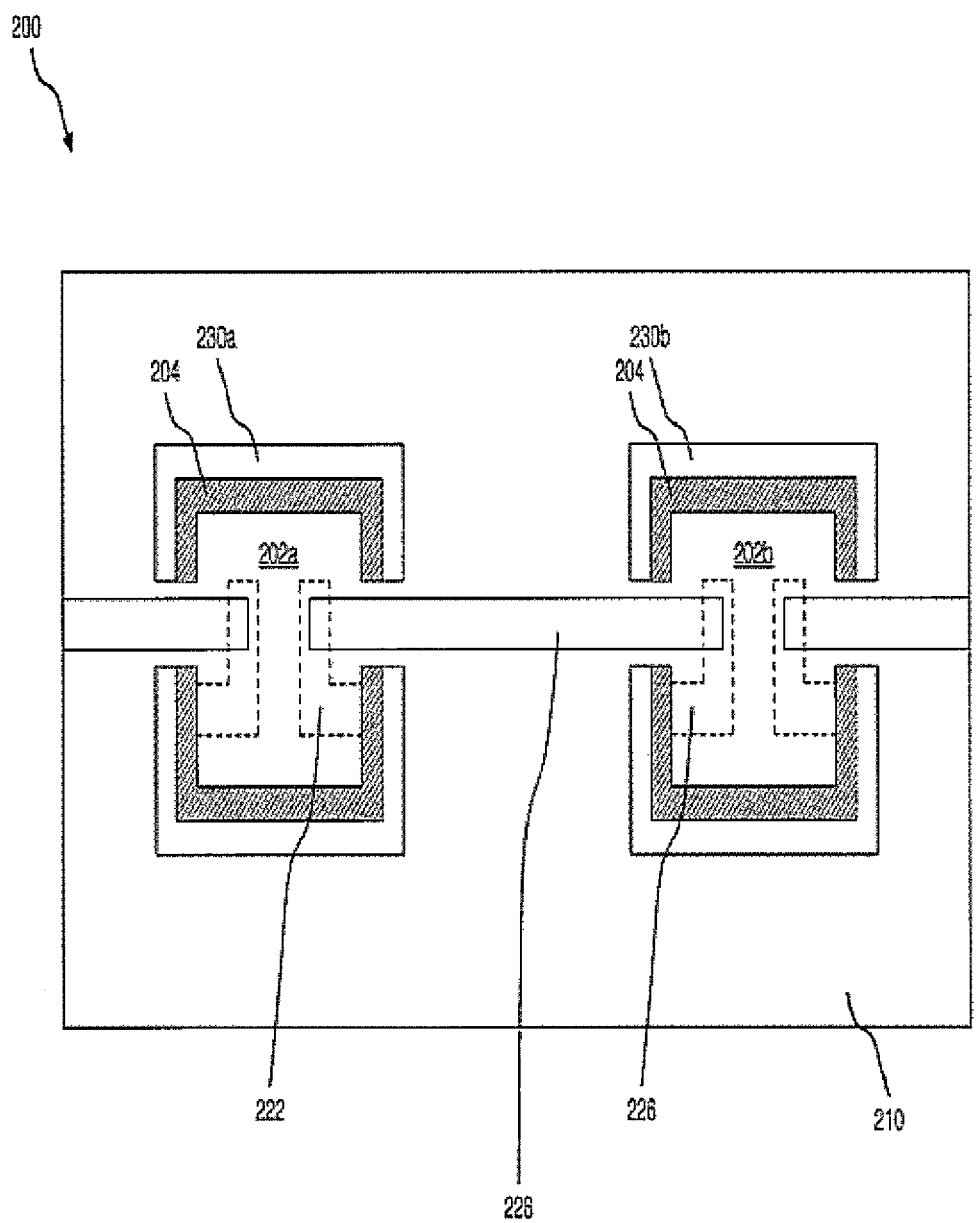
FIG. 6 is a schematic view from below of the arrangement of FIG. 5.

The carrier 208 is formed with first and second trenches 230a, 230b of an electrically conductive material, such as copper, which presents a low impedance to radio frequency currents. The trenches 230a, 230b surround the lower faces of the first and second dielectric resonators 202a, 202b in the plane of the upper groundplane layer 210, as can be seen more clearly from FIG. 6. FIG. 6 shows the following from FIG. 5: the filter 200; dielectric resonators 202a, 202b; electrically conductive coatings 204; upper conductive layer 210; PCB connection tracks 222, 226; common connector track 228; and trenches 230a, 230b. The trenches 230a, 230b extend from an upper surface of the upper conductive layer 210 into the carrier 208 through the upper and lower PCB dielectric layers 218, 216 and the central connection layer 214, such that a base portion 232 of each trench 230a, 230b is positioned adjacent the lower groundplane 212. The base portion 232 of each trench 230a, 230b is electrically coupled to the lower groundplane 212 by means of a via 234 or by directly bonding the base portion 232 of the trench 230a, 230b to the lower groundplane 212, for example using a conductive bond such as solder, or plating using an electro-plating process. Thus, the combination of the upper conductive layer 210, side walls 236 and base portions 232 of the trenches 230a, 230b and the lower groundplane 212, forms respective first and second electrically conductive enclosing formations, as indicated in dashed outline at 238a and 238b in FIG. 5. These electrically conductive enclosing formations 238a, 238b are electrically grounded by virtue of the lower groundplane 212, and are electrically coupled to the electrically conductive coatings 204 of the first and second dielectric resonators 202a, 202b, and thus the first and second dielectric resonators 202a, 202b are substantially enclosed in respective first and second grounded electrically conductive enclosures made up of the coatings 204 and the respective first and second enclosing formations 238a, 238b. These grounded electrically conductive enclosures have the effect of enclosing fields (electric or magnetic) present in the dielectric resonators 202a, 202b, thus improving isolation of, and reducing leakage from, the dielectric resonators 202a, 202b, and thus lead to improved characteristics of the filter 200 in comparison to filters such as that illustrated in FIG. 2. It will be noted that, in the embodiment illustrated in FIGS. 5 and 6, the common connector track 228 extends through the side walls 236 (FIG. 5) of the trenches 230a, 230b. Thus, a gap exists in each of the enclosures enclosing the dielectric resonators 202a, 202b. Nevertheless, the combination of the enclosing formations 238a, 238b (FIG. 5) and the coverings 204 to form the enclosures enclosing the dielectric resonators 202a, 202b provides improved performance compared to the filter arrangement of FIG. 2. In the example illustrated in FIG. 5, the trenches 230a, 230b take the form of open-topped channels with a generally rectangular cross-section, but it will be appreciated that the same effect can be achieved using trenches of any cross-sectional shape, for example a trench with a generally U-shaped cross-section, such that the base portion is curved, a trench having a generally V-shaped cross-section, or a trench with substantially parallel sides and a base portion having a generally V-shaped cross-section.

Figure 7:
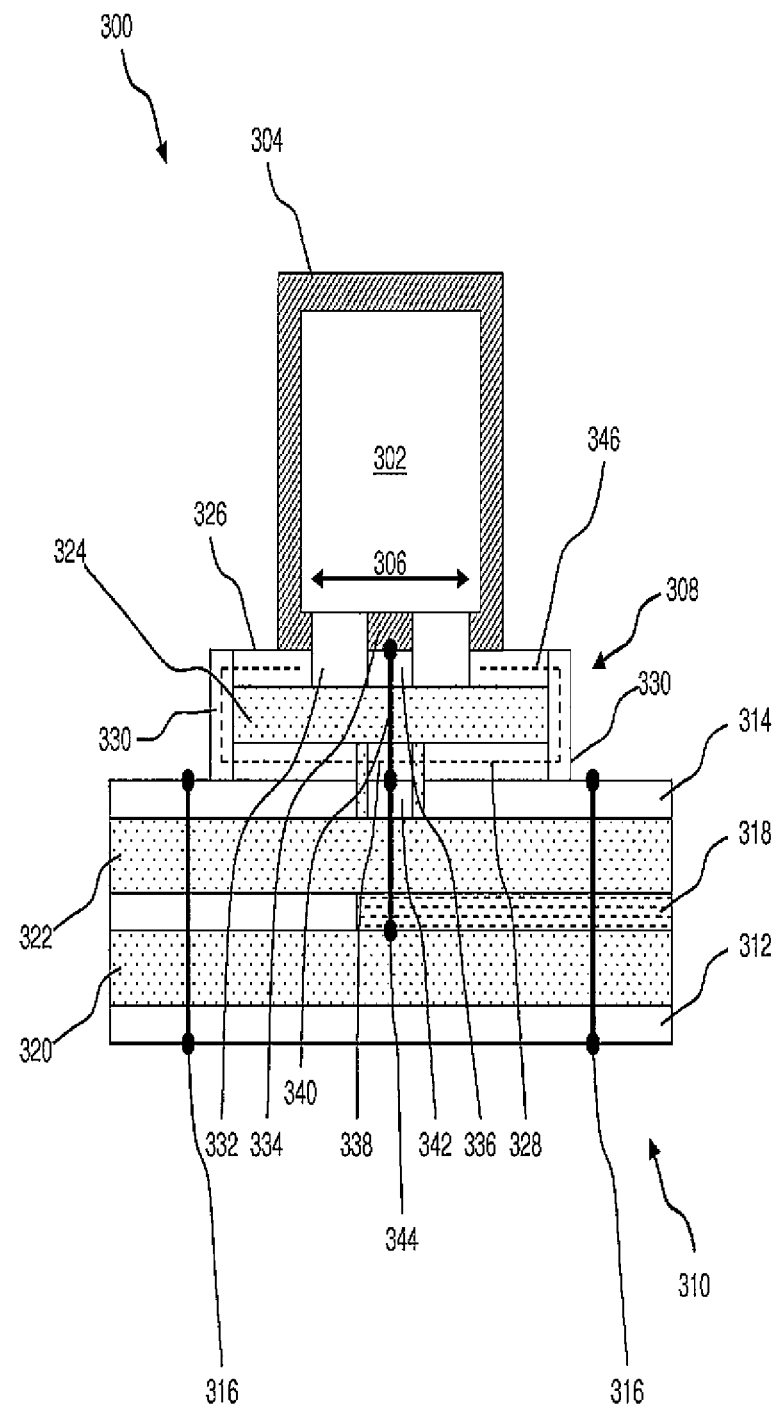
FIG. 7 is a schematic cross-sectional representation of a filter according to an alternative embodiment of the present invention.

FIG. 7 is a schematic cross-sectional representation of an alternative dielectric resonator filter 300. In the arrangement illustrated in FIG. 7, the filter 300 uses a single dielectric resonator 302 formed as a generally cuboidal puck of a dielectric material such as a ceramic having a high dielectric constant. The dielectric resonator 302 has a coating or covering 304 of an electrically conductive material such as silver or another electrically conductive metal. The coating 304 extends over all six faces of the dielectric resonator 302, although an aperture 306 is provided in the coating 304 in one face (shown as the lower face in FIG. 7) of the dielectric resonator 302, to permit connections to be made to the dielectric material of the dielectric resonator 302.

The dielectric resonator 302 is mounted on a first carrier 308, which in turn is mounted on a second carrier 310, such that the second carrier 310 may be regarded as a "mother" carrier and the first carrier 308 may be regarded as a "daughter" carrier.

The second carrier 310 is of a dielectric material such as, for example PCB material, ceramic or glass, having lower and upper groundplane layers 312, 314, which are electrically connected by vias 316, and a central connection layer 318. Lower and upper layers 320, 322 of dielectric material such as PCB material, ceramic or glass are disposed between the lower groundplane layer 312 and the central connection layer 318 and between the central connection layer 318 and the upper groundplane layer 314 respectively.

The first carrier 308 comprises a central layer 324 of a dielectric material, such as PCB substrate material, ceramic or glass. Disposed on upper and lower faces of the central layer 324 are upper and lower conductive layers 326, 328 of an electrically conductive material, such as copper or another metal which presents a low impedance to radio frequency currents. The lower conductive layer 328 is disposed on and electrically coupled to the upper groundplane layer 314 of the second carrier 310. The central layer 324 of the first carrier 310 also has walls 330 of an electrically conductive material such as copper or another metal, which are electrically coupled to the upper and lower conductive layers 326, 328.

The upper conductive layer 326 is provided with an aperture 332 of a shape and size generally corresponding to the aperture 306 in the coating 304 of the dielectric resonator 302. It will be appreciated that the aperture 332 in the upper conductive layer 326 need not correspond exactly to the aperture 306 in the coating 304 of the dielectric resonator 302. For example, the aperture 306 in the coating 304 may be slightly larger than the aperture 332 in the upper conductive layer 326. The lower face of the dielectric resonator 302 is mounted on the upper conductive layer 326, with the aperture 306 of the dielectric resonator 302 aligned with the aperture 332 of the upper conductive layer 326 of the first carrier 308, such that that portion of the electrically conductive coating 304 which surrounds the aperture 306 electrically couples the coating 304 of the dielectric resonator 302 to the upper conductive layer 326 of the first carrier 308.

The dielectric resonator 302 is provided with one or more coupling structures 334, which are electrically coupled to one or more corresponding PCB connection tracks 336 disposed within the aperture 332 of the upper conductive layer 326 of the first carrier 308, to permit a signal to be filtered to be input to the dielectric resonator 302, and/or to permit a filtered output signal to be extracted from the dielectric resonator 302. The PCB connection track 336 is electrically connected to a further PCB connection track 338 provided on the lower conductive layer 328 of the first carrier 308 by a via 340. This further PCB connection track 338 is electrically coupled to a PCB connection pad 342 provided in the upper groundplane layer 314 of the second carrier 310, which PCB connection pad 342 is electrically coupled to the central connection layer 318 by means of a via 344, to permit input and output signals to be input to and extracted from the dielectric resonator 302 through the central connection layer 318.

It will be appreciated that the upper conductive layer 326, the lower conductive layer 328 and the walls 330 of the first carrier 308 together constitute a continuous electrically conductive enclosing formation, as indicated in dashed outline at 346. This electrically conductive enclosing formation 346 is electrically grounded, by virtue of the electrical connection between the lower conductive layer 328 and the upper groundplane layer 314 of the second carrier 310, and is electrically coupled to the electrically conductive coating 304 of the dielectric resonators 302, and thus the dielectric resonator 302 is substantially enclosed in a grounded electrically conductive enclosure made up of the coating 304 and the enclosing formation 346. This grounded electrically conductive enclosure has the effect of enclosing fields (electric or magnetic) present in the dielectric resonator 302, thus improving isolation of, and reducing leakage from, the dielectric resonator 302, and thus leads to improved characteristics of the filter 300 in comparison to filters such as that illustrated in FIG. 1.

Figure 8:
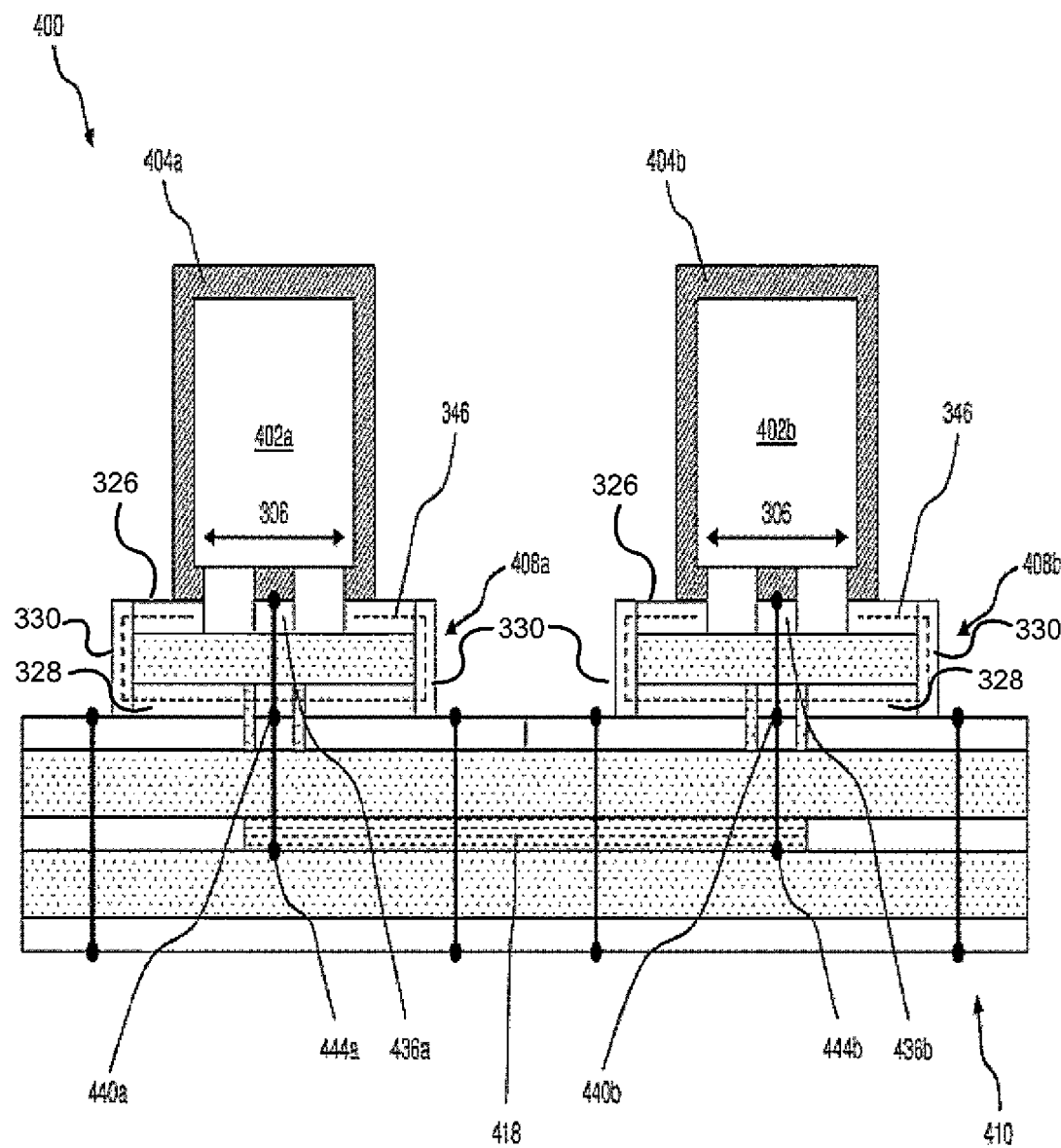
FIG. 8 is a schematic representation of a cascaded filter arrangement using the filter illustrated in FIG. 7.

FIG. 8 is a schematic cross-sectional representation of a filter arrangement 400 made up of two cascaded filters of the type described above with reference to FIG. 7.

The filter arrangement illustrated in FIG. 8 uses first and second dielectric resonators 402a, 402b of the type described above, and so like reference numerals have been used in FIG. 8 to refer to like elements. The resonators 402a, 402b have respective coverings 404a, 404b, and apertures 306. The first and second dielectric resonators 402a, 402b are mounted on respective first ("daughter") carriers 408a, 408b, which are in turn mounted on a second carrier 410. The dielectric resonators 402a, 402b and the first carriers 408a, 408b are of the type described above, and so will not be described again in detail here.

The second carrier 410 is similar in structure and construction to the second carrier 310 described above with respect to FIG. 7, and so will not be described again in detail here. However, the second carrier 410 differs from the second carrier 310 described above with respect to FIG. 7 in that that the central connection layer 418 is used to connect an output of the first dielectric resonator 402a to an input of the second dielectric resonator by means of vias 440a, 444a and 440b, 444b, which connect PCB connection tracks 436a, 436b to each other, thereby permitting transfer of signals between the first and second dielectric resonators 402a, 402b.

As in the single resonator filter 300 illustrated in FIG. 7, in FIG. 8 the upper conductive layer 326, the lower conductive layer 328 and the walls 330 of the first carrier 308 together constitute a continuous electrically conductive enclosing formation, as indicated in dashed outline at 346. This electrically conductive enclosing formation 346 is electrically coupled to the electrically conductive coating 304 of the dielectric resonators 302, and thus the dielectric resonator 302 is substantially enclosed in a conductive enclosure made up of the coating 304 and the enclosing formation 346. This electrically conductive enclosure has the effect of enclosing fields (electric or magnetic) present in the dielectric resonator 302, thus improving isolation of, and reducing leakage from, the dielectric resonator 302, and thus leads to improved characteristics of the filter 300 in comparison to filters such as that illustrated in FIG. 1. In the filter 400 illustrated in FIG. 8, which uses two cascaded dielectric resonators 402a, 402b, this improved isolation and reduced leakage results in improved filter characteristics over known cascaded dielectric resonator arrangements.

It will be appreciated that the filter arrangement of the present invention provide improved isolation and reduced leakage, which gives rise to improved filter characteristics and performance, particularly in the cascaded resonator filter arrangements discussed above by reference to FIGS. 3, 5 and 8. Additionally, the filter arrangement of the present invention may be employed in a duplex or diplex filter arrangement in which a transmit filter and a receive filter are mounted on a common carrier, by electrically isolating the connecting structures of the transmit and receive structures from each other. In such an arrangement the improved isolation and reduced leakage of the filter of the present invention gives rise to improved filter characteristics and performance of both the transmit filter and the receive filter.

The invention claimed is:
1. An apparatus, comprising:
a carrier comprising one or more layers; and
a multi-mode filter formed on the carrier, comprising:
a dielectric resonator mounted on the carrier, the dielectric resonator having a covering of an electrically conductive material in which there is provided an aperture; and at least one coupling structure formed in the aperture for coupling input signals to the dielectric resonator or for extracting filtered output signals from the dielectric resonator, an enclosing formation of electrically conductive material provided as part of the carrier, where the enclosing formation is electrically coupled to the electrically conductive covering of the dielectric resonator, such that the covering and the enclosing formation together form an electrically conductive enclosure for the dielectric resonator, wherein the enclosing formation comprises a continuous or almost continuous formation of grounded electrically conducting material and a trench of electrically conductive material which surrounds the dielectric resonator and which resides in the one or more layers of the carrier, the trench being electrically grounded.

2. The apparatus according to claim 1, wherein the carrier is of a printed circuit board material, or a ceramic material, or glass.

3. An apparatus according to claim 1, wherein the one or more layers of the carrier comprise one or more conductive layers and one or more dielectric material layers, and the trench resides in a conductive layer of the one or more conductive layers and an adjacent dielectric material layer of the one or more dielectric material layers.

4. An apparatus according to claim 1, wherein the one or more layers of the carrier comprise a plurality of conductive layers and a plurality of dielectric material layers, and the trench resides in multiple adjacent layers comprising multiple conductive layers and multiple dielectric material layers.

5. The apparatus according to claim 1, wherein the trench comprises a side wall and a base portion, such that the enclosing formation comprises the side wall and the base portion of the trench.

6. The apparatus according to claim 5, wherein the carrier is provided with a conductive layer, of the one or more layers, on which the dielectric resonator is mounted, the conductive layer being electrically coupled to the trench such that the enclosing formation comprises a portion of the conductive layer and the side wall and base portion of the trench.

7. The apparatus according to claim 1, wherein the enclosing formation has an aperture generally corresponding to the aperture of the covering of the dielectric resonator, the enclosing formation being electrically coupled to the covering of the dielectric resonator such that the aperture of the covering is aligned with the aperture of the enclosing formation.

8. The apparatus according to claim 7, wherein each coupling structure of the at least one coupling structure is electrically coupled to a corresponding connector track provided within the aperture of the enclosing formation.

9. The apparatus of claim 1, wherein:
the multi-mode filter is a first multi-mode filter, the dielectric resonator is a first dielectric resonator, the aperture is a first aperture, the at least one coupling structure is an at least one first coupling structure, the enclosure formation is a first enclosing formation, and the trench is a first trench; and the apparatus further comprises a second multi-mode filter formed on the carrier, comprising:

a second dielectric resonator mounted on the carrier, the second dielectric resonator having a covering of an electrically conductive material in which there is provided a second aperture; and at least one second coupling structure formed in the second aperture for coupling input signals to the second dielectric resonator or for extracting filtered output signals from the second dielectric resonator, a second enclosing formation of electrically conductive material provided as part of the carrier, where the second enclosing formation is electrically coupled to the electrically conductive covering of the second dielectric resonator, such that the covering and the second enclosing formation together form an electrically conductive enclosure for the second dielectric resonator, wherein the second enclosing formation comprises a continuous or almost continuous formation of grounded electrically conducting material and a second trench of electrically conductive material which surrounds the second dielectric resonator and which resides in the one or more layers of the carrier, the second trench being electrically grounded.

10. The apparatus of claim 9, wherein the first filter is a transmit filter and the second filter is a receive filter.

11. An apparatus according to claim 9, wherein the carrier comprises a connector track formed to electrically couple an output, as a coupling structure of the at least one first coupling structure, of the first filter to an input, as a coupling structure of the at least one first coupling structure, of the second filter.

12. An apparatus according to claim 11, wherein the one or more layers of the carrier comprise one or more conductive layers and one or more dielectric material layers, and each of the first and second trenches resides in a conductive layer of the one or more conductive layers and an adjacent dielectric material layer of the one or more dielectric material layers.

13. An apparatus according to claim 11, wherein the one or more layers of the carrier comprise a plurality of conductive layers and a plurality of dielectric material layers, and each of the first and second trenches resides in multiple adjacent layers comprising multiple conductive layers and multiple dielectric material layers.

14. An apparatus according to claim 13, wherein the connector track extends through adjacent side walls that face each other of the first and second trenches, and a gap exists in each of the first and second enclosing formations around the connector track.

15. An apparatus according to claim 13, wherein each of the first and second trenches resides in multiple adjacent layers comprising multiple conductive layers and multiple dielectric material layers and ends at a final layer at a side of the carrier that is opposite another side of the carrier on which the first and second dielectric resonators are mounted, wherein the final layer is a groundplane layer electrically coupled to the first and second trenches.

* * * * *